(12) United States Patent
Maki

(10) Patent No.: US 6,870,777 B2
(45) Date of Patent: Mar. 22, 2005

(54) SEMICONDUCTOR MEMORY DEVICE HAVING SELF-TIMING CIRCUIT

(75) Inventor: Yasuhiko Maki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/103,017

(22) Filed: Mar. 22, 2002

(65) Prior Publication Data

US 2002/0191446 A1 Dec. 19, 2002

(30) Foreign Application Priority Data

Jun. 15, 2001 (JP) ........................................ 2001-182067

(51) Int. Cl.$^7$ .............................. G11C 7/00; G11C 7/02; G11C 8/00
(52) U.S. Cl. ........................ 365/189.07; 3635/189.08; 3635/191; 3635/210; 3635/230.03; 3635/230.06; 3635/230.08; 3635/233
(58) Field of Search ........................ 365/189.07, 189.08, 365/191, 210, 230.03, 230.06, 230.08, 233, 194

(56) References Cited

U.S. PATENT DOCUMENTS

| | | | | |
|---|---|---|---|---|
| 4,939,693 A | * | 7/1990 | Tran ........................... | 365/190 |
| 5,018,111 A | * | 5/1991 | Madland ...................... | 365/233 |
| 5,440,515 A | * | 8/1995 | Chang et al. ................ | 365/194 |
| 5,473,568 A | * | 12/1995 | Okamura ..................... | 365/210 |
| 5,596,539 A | * | 1/1997 | Passow et al. .............. | 365/210 |
| 5,608,681 A | * | 3/1997 | Priebe et al. ................ | 365/207 |
| 5,694,369 A | * | 12/1997 | Abe ............................ | 365/210 |
| 5,732,035 A | * | 3/1998 | Komarek et al. ........... | 365/203 |
| 5,742,552 A | * | 4/1998 | Greenberg ................... | 365/210 |
| 6,194,932 B1 | * | 2/2001 | Takemae et al. ............ | 327/158 |
| 6,198,689 B1 | * | 3/2001 | Yamazaki et al. ........... | 365/233 |
| 6,239,635 B1 | * | 5/2001 | Matsuzaki ................... | 327/160 |
| 6,246,622 B1 | * | 6/2001 | Sugibayashi ................ | 365/210 |
| 6,285,604 B1 | * | 9/2001 | Chang ......................... | 365/200 |
| 6,288,950 B1 | * | 9/2001 | Koike .................... | 365/189.09 |
| 6,295,241 B1 | * | 9/2001 | Watanabe et al. ........... | 365/208 |
| 6,529,436 B1 | * | 3/2003 | Brown ......................... | 365/226 |
| 6,643,204 B1 | * | 11/2003 | Agrawal ...................... | 365/210 |
| 2002/0015333 A1 | * | 2/2002 | Furumochi ................... | 365/196 |

* cited by examiner

*Primary Examiner*—David Nelms
*Assistant Examiner*—Ly Duy Pham
(74) *Attorney, Agent, or Firm*—Arent Fox, PLLC

(57) ABSTRACT

A semiconductor memory device includes a data access path for accessing a memory cell, a signal drive circuit which drives a signal on said data access path, a dummy path that emulates said data access path, and a dummy drive circuit which emulates said signal drive circuit, wherein said dummy path has a smaller load than said data access path, and said dummy drive circuit has a smaller drive capacity than said signal drive circuit.

8 Claims, 6 Drawing Sheets

SEMICONDUCTOR MEMORY DEVICE HAVING SELF-TIMING CIRCUIT

BACKGROUND OF THE INVENTION

1. Field of the Invention

The present invention generally relates to semiconductor memory devices, and particularly relates to a semiconductor memory device equipped with a timing control circuit that simulates signal delay.

2. Description of the Related Art

In order to increase the operation speed of semiconductor memory devices, diligent timing control becomes necessary regarding the operations of semiconductor memory devices. When an attempt is made to manufacture increasingly fine structures in order to increase the circuit density of semiconductor memory devices, an increase in product variation may ensue. If such product variation exists, it is not easy to attend to diligent timing control.

In conventional technologies, timing control signals that define the operation timing of internal circuitry are generated from external signals by use of delay circuits or the like. The timing of timing control signals generated in this manner may deviate if parasitic load capacitance or resistance associated with wires exhibits variation due to the product variation. Timing settings must thus be made with a sufficient margin by taking into account such deviations, which is a factor that hinders effort toward the attainment of high-speed semiconductor memory devices.

In order to obviate this problem, some types of semiconductor memory devices simulate signal delay inside the semiconductor memory devices, thereby generate accurate timing control signals. Such timing control circuit is called a self-timing circuit. For example, the path that incurs the longest timing delay at the time of memory access is taken into consideration, and a circuit is provided to simulate the signal delay along this path, thereby generating timing control signals for defining the operation timing of internal circuitry. In this method, the timing control signal has timing that emulates actual memory access, so that timing deviation caused by the product variation can be suppressed to some extent.

The path that incurs the longest timing delay used for generating the timing control signal is a path that is farthest away from the input/output circuit, and that accesses the memory cell that is farthest away from the word decoder.

FIG. 1 is an illustrative drawing for explaining timing compensation when the path farthest away from an input/output circuit and a word decoder is used.

The semiconductor memory device of FIG. 1 includes a control circuit 11, a decoder circuit 12, a memory cell array 13, a read-write amplifier 14, a dummy word decoder 15, a dummy word line 16, a dummy memory cell 17, and a dummy bit line 18. At the time of an actual data read operation, the decoder circuit 12 selectively activates a word line of the memory cell array 13 in response to a clock signal CK and an address signal ADDRESS supplied to the control circuit 11 from an exterior of the device, thereby supplying a read signal to a memory cell 19. A signal path along which the read signal propagates is shown as signal paths P1, P2 and P3. The memory cell 19 that is accessed in the memory cell array 13 is shown as a cell that is farthest away from the control circuit 11. Data read from the memory cell 19 is supplied to the read-write amplifier 14 through a path p4 that corresponds to bit lines of the memory cell array 13. The data retrieval paths P1, P2, P3, and P4 together form the path that incurs the longest delay for a data read operation, and is thus a critical path that is most critical in terms of timing.

In the meantime, the dummy word decoder 15 activates the dummy word line 16 based on the clock signal CK and the address signal ADDRESS supplied to the control circuit 11 from the exterior of the device, thereby supplying a read signal to the dummy memory cell 17. A path along which this read signal propagates is shown as paths P1, P6, and P7. A dummy-memory-cell signal read from the dummy memory cell 17 is supplied through the dummy bit line 18 to the control circuit 11. Based on this dummy-memory-cell signal, the control circuit 11 supplies a sense amplifier activation signal to the read-write amplifier 14 so as to amplify the real data that is read. The path along which the dummy-memory-cell signal and the sense amplifier activation signal propagate is shown as paths P8, P9, and P5.

In this manner, the real data that is read through the data retrieval paths P1, P2, P3, and P4 is amplified by the read-write amplifier 14 and then output to the exterior of the device through a path P10. The path along which the dummy-memory-cell signal is retrieved has a timing delay longer than that of the critical path that has the longest timing delay in the memory cell array 13. This insures that the reading of data along the critical path is properly performed. In this manner, the self-timing circuit generates a timing control signal (i.e., the sense amplifier activation signal) that simulates real memory access, thereby canceling a timing deviation caused by product variation.

In the configuration described above, the dummy memory cell 17 is provided farther away than the memory cell 19 that is farthest away from the control circuit 11. Accordingly, the load of driving the dummy word decoder 15, the dummy word line 16, the dummy bit line 18, etc., is greater than the maximum load that can be incurred when reading data from the memory cell array 13. This gives rise to a problem in that power consumption by the self-timing circuit increases. The power consumption by the self-timing circuit is not an ignorable size in memory devices for which a reduction of power consumption is a primary consideration.

Accordingly, there is a need for a semiconductor memory device that is provided with a self-timing circuit for simulating signal delay so as to insure stability against product variation where the self-timing circuit incurs relatively small power consumption.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a semiconductor memory device according to the present invention includes a data access path for accessing a memory cell, a signal drive circuit which drives a signal on said data access path, a dummy path that emulates said data access path, and a dummy drive circuit which emulates said signal drive circuit, wherein said dummy path has a smaller load than said data access path, and said dummy drive circuit has a smaller drive capacity than said signal drive circuit.

The semiconductor memory device as described above drives the dummy path having a smaller lard than the actual data access path by use of the dummy drive circuit having a smaller drive capacity than the actual signal drive circuit. This makes it possible to achieve a circuit configuration that consumes a less electric power than the related-art self-timing circuit, yet achieves timing control that cancels timing deviations caused by product variation.

According to an embodiment of the present invention, a dummy word decoder, a dummy word line circuit, a dummy memory cell, and a dummy bit line circuit are situated at a corner of the memory cell array closest to the decoder circuit and the input/output circuit. Further, the dummy word line circuit includes a dummy word line that extends in the same direction as word lines of the memory cell array, and is folded to make a U-turn. The dummy bit line circuit includes dummy bit lines that extend in the same direction as the bit lines of the memory cell array, and are folded to make a U-turn.

In the semiconductor memory device as described above, the dummy path for emulating the data access path can be implemented as a relatively short path.

Further, according to one aspect of the present invention, a semiconductor memory device includes a self-timing circuit which emulates data access to a memory cell so as to generate a timing control signal, the self-timing circuit using a dummy path having a relatively small load compared with a circuit that is emulated, and driving the dummy path by a drive capacity that is proportionately small.

The semiconductor memory device as described above employs the dummy path having a relatively small load compared with a circuit that is emulated, and drives the dummy path by a drive capacity that is proportionately small, thereby making it possible to achieve a circuit configuration that consumes a less electric power than the related-art self-timing circuit, yet achieving timing control that cancels timing deviations caused by product variation.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
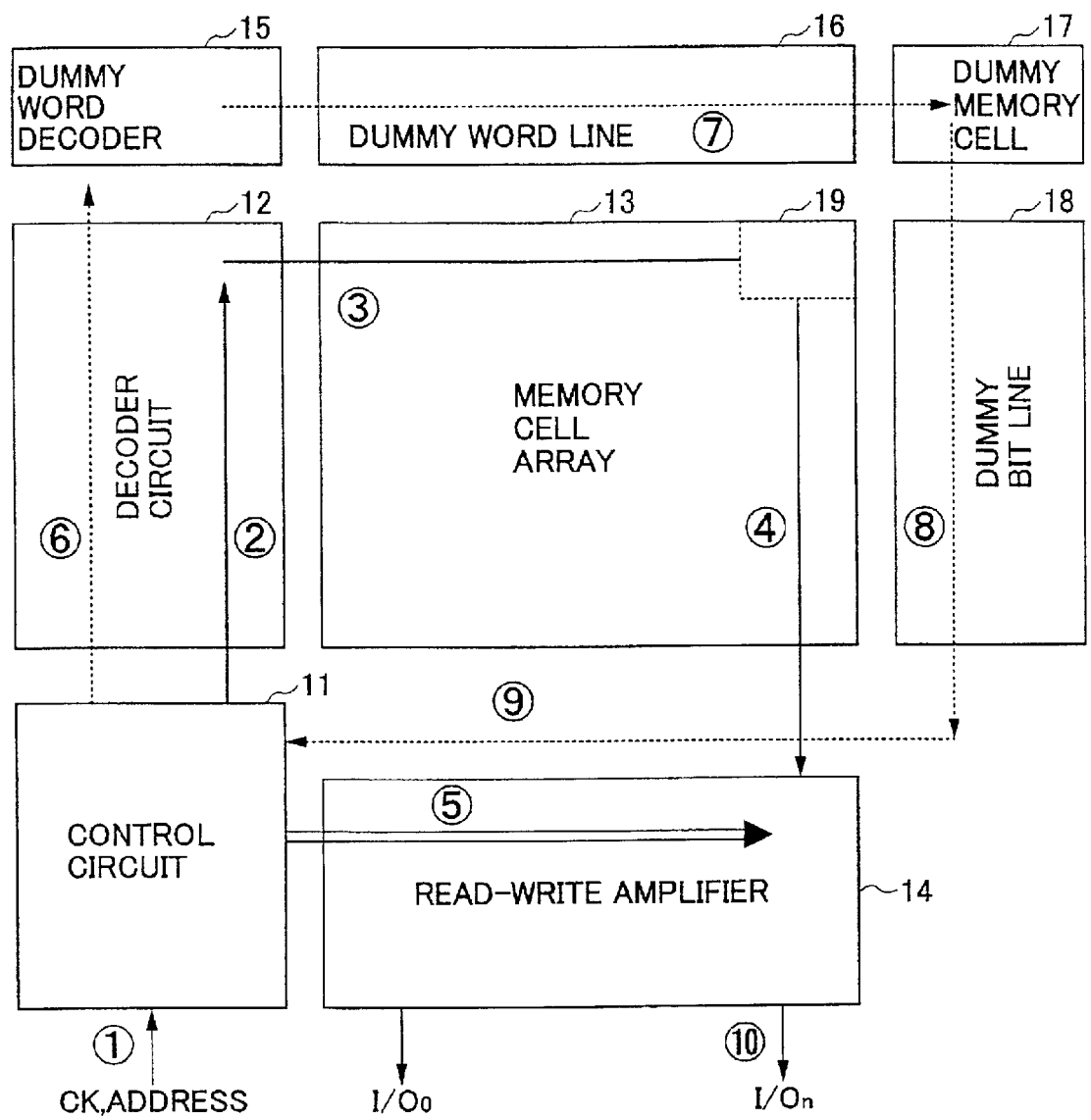
FIG. 1 is an illustrative drawing for explaining a related-art timing compensation when a path farthest away from an input/output circuit and a word decoder is used.
Figure 2:
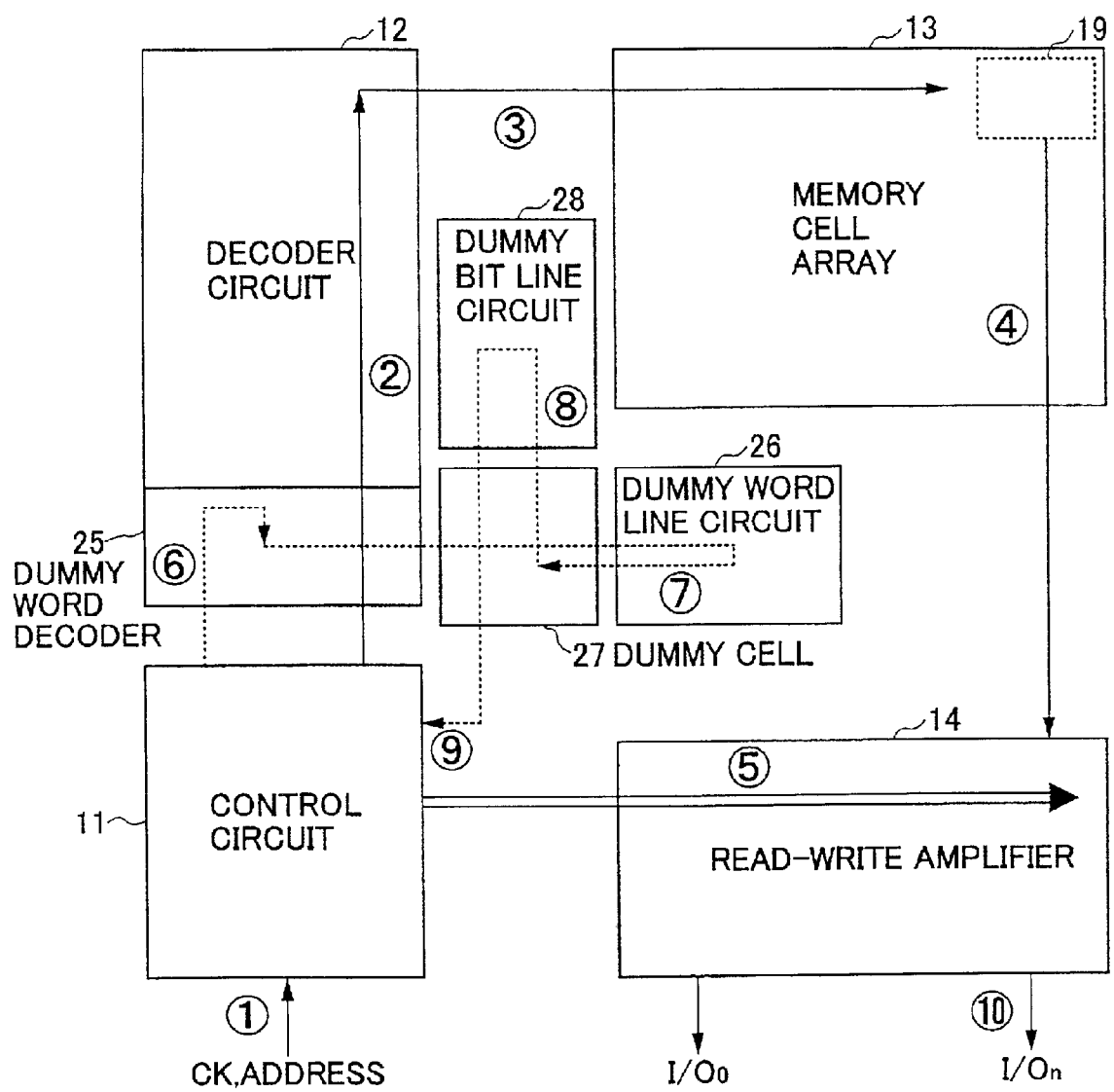
FIG. 2 is a diagram showing a configuration of a semiconductor memory device provided with a self-timing circuit according to the present invention.

FIG. 2 is a diagram showing a configuration of a semiconductor memory device provided with a self-timing circuit according to the present invention.

The semiconductor memory device of FIG. 2 includes the control circuit 11, the decoder circuit 12, the memory cell array 13, the read-write amplifier 14, a dummy word decoder 25, a dummy word line circuit 26, a dummy memory cell 27, and a dummy bit line circuit 28.

The dummy word decoder 25, the dummy word line circuit 26, the dummy memory cell 27, and the dummy bit line circuit 28 together constitute a self-timing circuit of the present invention. The dummy word decoder 25 of this self-timing circuit is situated at a position closer to the control circuit 11 than the decoder circuit 12. The dummy word line circuit 26, the dummy memory cell 27, and the dummy bit line circuit 28 are positioned closer to the control circuit 11 than the memory cell array 13.

At the time of an actual data read operation, the decoder circuit 12 selectively activates a word line of the memory cell array 13 in response to a clock signal CK and an address signal ADDRESS supplied to the control circuit 11 from an exterior of the device, thereby supplying a read signal to the memory cell 19. A signal path along which the read signal propagates is shown as signal paths P1, P2 and P3. The memory cell 19 that is accessed in the memory cell array 13 is shown as a cell that is farthest away from the control circuit 11. Data read from the memory cell 19 is supplied to the read-write amplifier 14 through a path p4 that corresponds to bit lines of the memory cell array 13. The data retrieval paths P1, P2, P3, and P4 together form the path that incurs the longest delay for a data read operation, and is thus a critical path that is most critical in terms of timing.

In the meantime, based on the clock signal CK and the address signal ADDRESS supplied from the exterior of the device, the control circuit 11 controls the dummy word decoder 25 situated closer to the control circuit 11 than the decoder circuit 12. The dummy word decoder 25 activates a dummy word line of the dummy word line circuit 26 that extends in the same direction as word lines of the memory cell array 13 and is folded to make a U-turn, thereby supplying a read signal to the dummy memory cell 27. A path along which this read signal propagates is shown as paths P1, P6, and P7.

A dummy-memory-cell signal read from the dummy memory cell 27 is supplied to the control circuit 11 through dummy bit lines of the dummy bit line circuit 28 that extends in the same direction as the bit lines of the memory cell array 13 and is folded to make a U-turn. Based on this dummy-memory-cell signal, the control circuit 11 supplies a sense amplifier activation signal to the read-write amplifier 14 so as to amplify the real data that is read. The path along which the dummy-memory-cell signal and the sense amplifier activation signal propagate is shown as paths P8, P9, and P5.

In this manner, the real data that is read through the data retrieval paths P1, P2, P3, and P4 is amplified by the read-write amplifier 14 and then output to the exterior of the device through a path P10.

Figure 3:
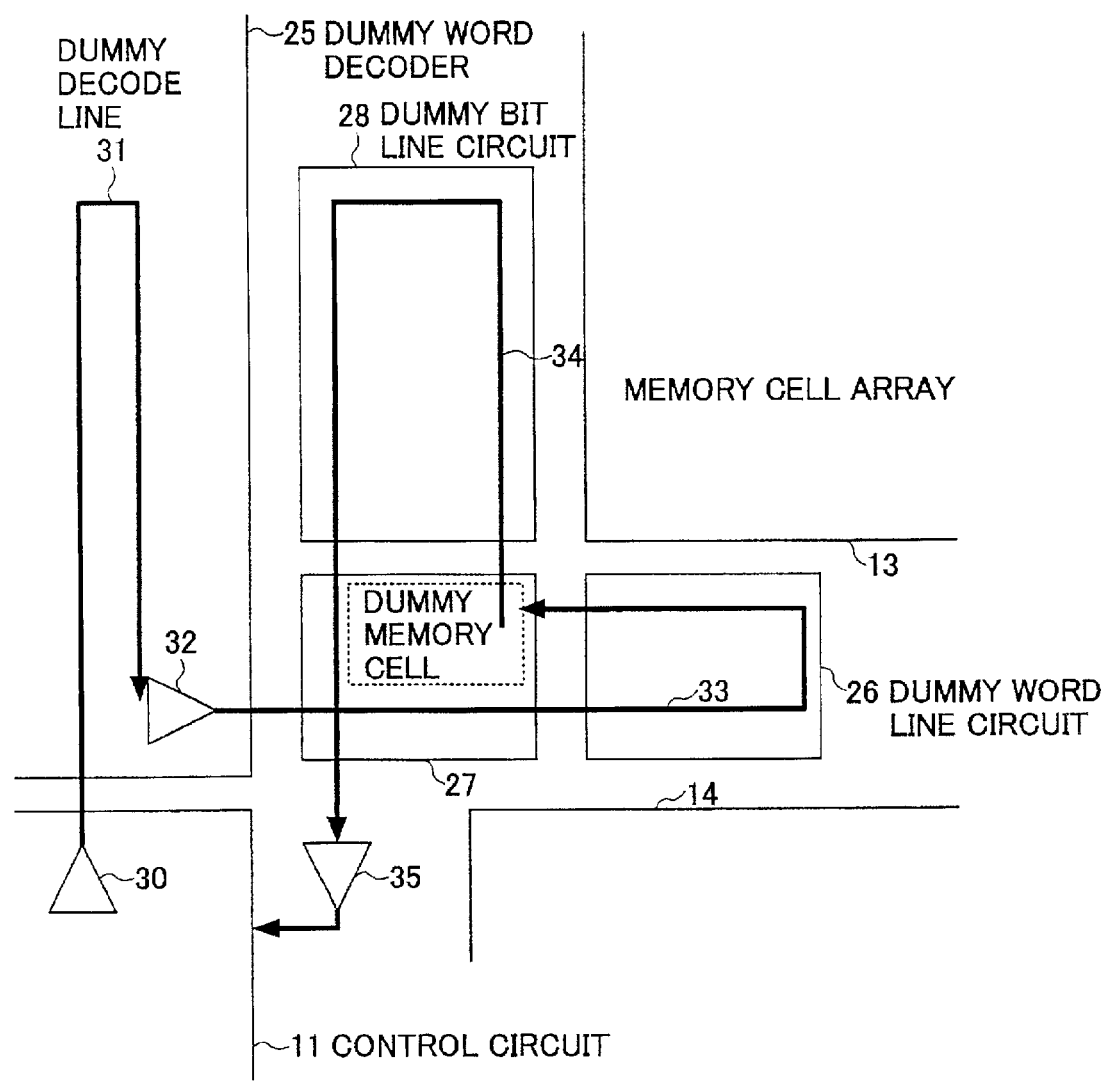
FIG. 3 is an enlarged view of signal propagation paths of a dummy word decoder, a dummy word line circuit, a dummy memory cell, and a dummy bit line circuit.

FIG. 3 is an enlarged view of signal propagation paths of the dummy word decoder 25, the dummy word line circuit 26, the dummy memory cell 27, and the dummy bit line circuit 28.

As shown in FIG. 3, the control circuit 11 is provided with a buffer 30, which supplies a signal to drive a dummy decode line 31 of the dummy word decoder 25. The dummy decode line 31 is folded to make a U-turn, and is connected to a buffer 32 at the end of the return path. In this manner, the signal from the buffer 30 is supplied to the buffer 32. In response to the supplied signal, the buffer 32 drives a dummy word line 33 of the dummy word line circuit 26. The dummy word line 33 makes a U-turn as shown in FIG. 3, and is connected to the dummy memory cell 27 at the end of the return path. Activation of the dummy word line 33 results in a cell signal being read from the dummy memory cell 27, and this cell signal is supplied to a buffer 35 through a dummy bit line 34 of the dummy bit line circuit 28. The dummy bit line 34 is folded to make a U-turn as shown in FIG. 3.

As described above, the configuration of the present invention uses a circuit arrangement as shown in FIG. 2 and FIG. 3, and folds the dummy decode line 31, the dummy word line 33, and the dummy bit line 34 to make a U-turn, thereby making it possible to provide the self-timing circuit at a corner of the memory cell array 13 in the proximity of the control circuit 11.

In the present invention, further, the load of each dummy circuit and the drive capacity of buffers that drive the respective dummy circuits are properly adjusted in the dummy word decoder 25, the dummy word line circuit 26, and the dummy bit line circuit 28, thereby achieving proper time delays. This aspect will be described in the following.

Figure 4:
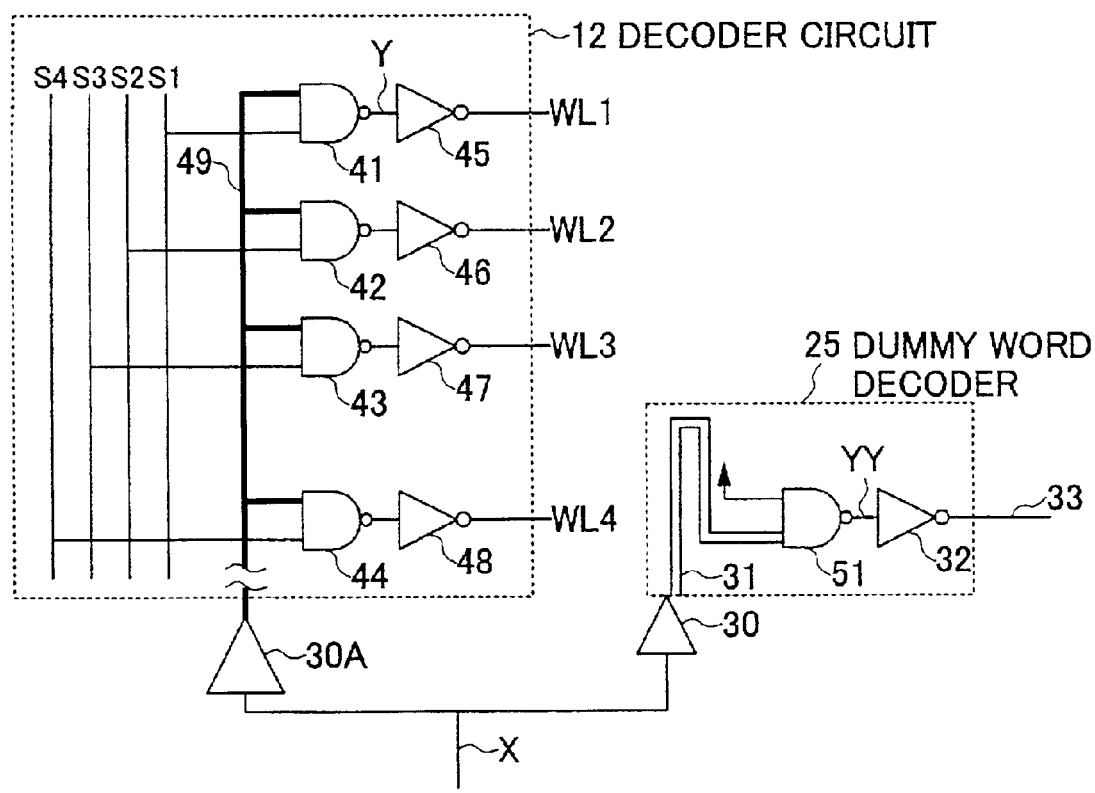
FIG. 4 is a circuit diagram for explaining the setting of a dummy load and a buffer drive capacity in a decoder circuit and the dummy word decoder.

FIG. 4 is a circuit diagram for explaining the setting of a dummy load and a buffer drive capacity in the decoder circuit 12 and the dummy word decoder 25.

As shown in FIG. 4, the decoder circuit 12 for actual data reading and data writing includes NAND circuits 41 through 44 and inverters 45 through 48, for example. Four decoded signal lines S1 through S4 are connected to the NAND circuits 41 through 44, respectively. One of these signal lines is set to HIGH to select one of the word lines WL1 through WL4 that extend inside the memory cell array 13. A buffer 30A of the control circuit 11 drives a decode line 49 to drive the NAND circuits so as to activate the selected word line at proper timing.

The dummy word decoder 25 includes a NAND circuit 51 and an inverter 32 (which is the same as the buffer 32 of FIG. 3). The NAND circuit 51 has the same circuitry structure as the NAND circuits 41 through 44, and the inverter 32 has the same circuitry structure as the inverters 45 through 48. At the same timing as the activation of the decode line 49 by the buffer 30A of the control circuit 11, the buffer 30 of the control circuit 11 activates the dummy decode line 31. The NAND circuit 51 is thus driven at proper timing, thereby activating the dummy word line 33 at proper timing.

The drive capacity of the buffer 30 is set equal to a quarter of the drive capacity of the buffer 30A, for example. The wire load of the dummy decode line 31 is set to a quarter of the wire load of the decode line 49. Further, the dummy decode line 31 is connected to the load that is equal in amount to one word, and the decode line 49 is connected to the load that is equal in amount to four words. As a result, a delay from a node X to a node Y through the buffer 30A and the decode line 49 will be equal to the delay from the node X to a node YY through the buffer 30 and the dummy decode line 31. Here, the node Y corresponds to the critical path that has the longest delay among all the data read paths.

Figure 5:
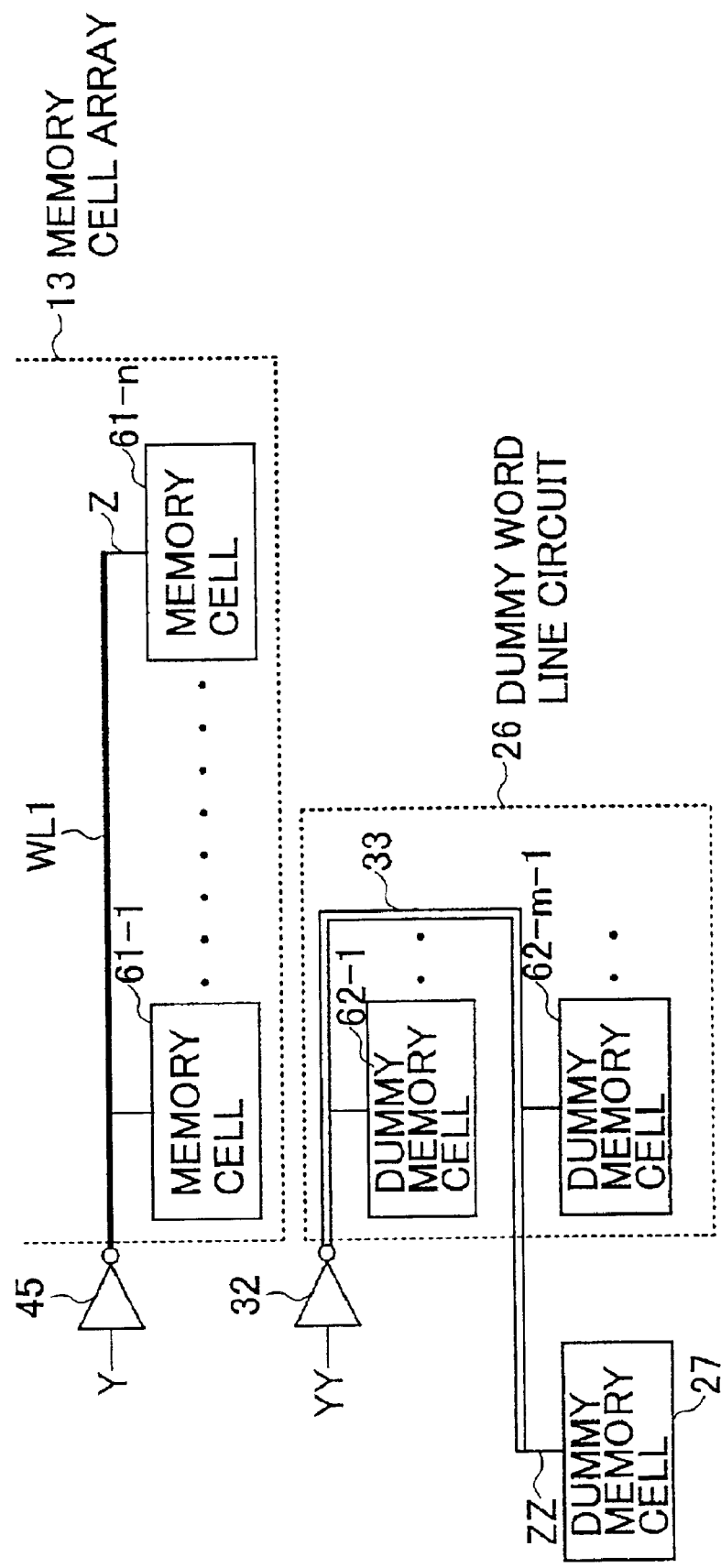
FIG. 5 is a circuit diagram for explaining the setting of a dummy load and a buffer drive capacity with respect to word lines of a memory cell array and a dummy word line of the dummy word line circuit.

FIG. 5 is a circuit diagram for explaining the setting of a dummy load and a buffer drive capacity with respect to word lines of the memory cell array 13 and the dummy word line 33 of the dummy word line circuit 26.

As shown in FIG. 5, the memory cell array 13 includes a word line WL1 and a plurality of memory cells 61-1 through 61-n. The memory cells 61-1 through 61-n are connected to the word line WL. Selective activation of the word line WL1 allows access to be made to the memory cells 61-1 through 61-n through bit lines. The total number n of the memory cells 61-1 through 61-n may be equal to 256, for example. The word line WL corresponds to the critical path, and is driven by the inverter 45 of the decoder circuit 12 (see FIG. 4).

The dummy word line circuit 26 includes the dummy word line 33 and a plurality of dummy memory cells 62-1 through 62-m-1. The dummy word line 33 is connected to the dummy memory cells 62-1 through 62-m-1, and is further connected to the dummy memory cell 27. The dummy word line 33 thus has a total of m dummy memory cells connected thereto. The number m of the dummy memory cells may be 16, for example. The dummy word line 33 is driven by the inverter 32 of the dummy word decoder 25.

The drive capacity of the inverter 32 is set to one sixteenth of the drive capacity of the inverter 45, for example, and the wire load of the dummy word line 33 is set to one sixteenth of the wire load of the word line WL1. Further, the dummy word line 33 has the 16 dummy memory cells connected thereto as loads, and the word line WL1 has the 256 memory cells connected thereto. As a result, the dummy load of the dummy word line circuit 26 is one sixteenth of the load of the word line WL1. With this provision, a delay from the node Y to a node Z through the inverter 45 and the word line WL1 becomes the same as the delay from the node YY to a node ZZ through the inverter 32 and the dummy word line 33. Here, the node Z corresponds to the critical path that has the longest delay among all the data read paths.

Figure 6:
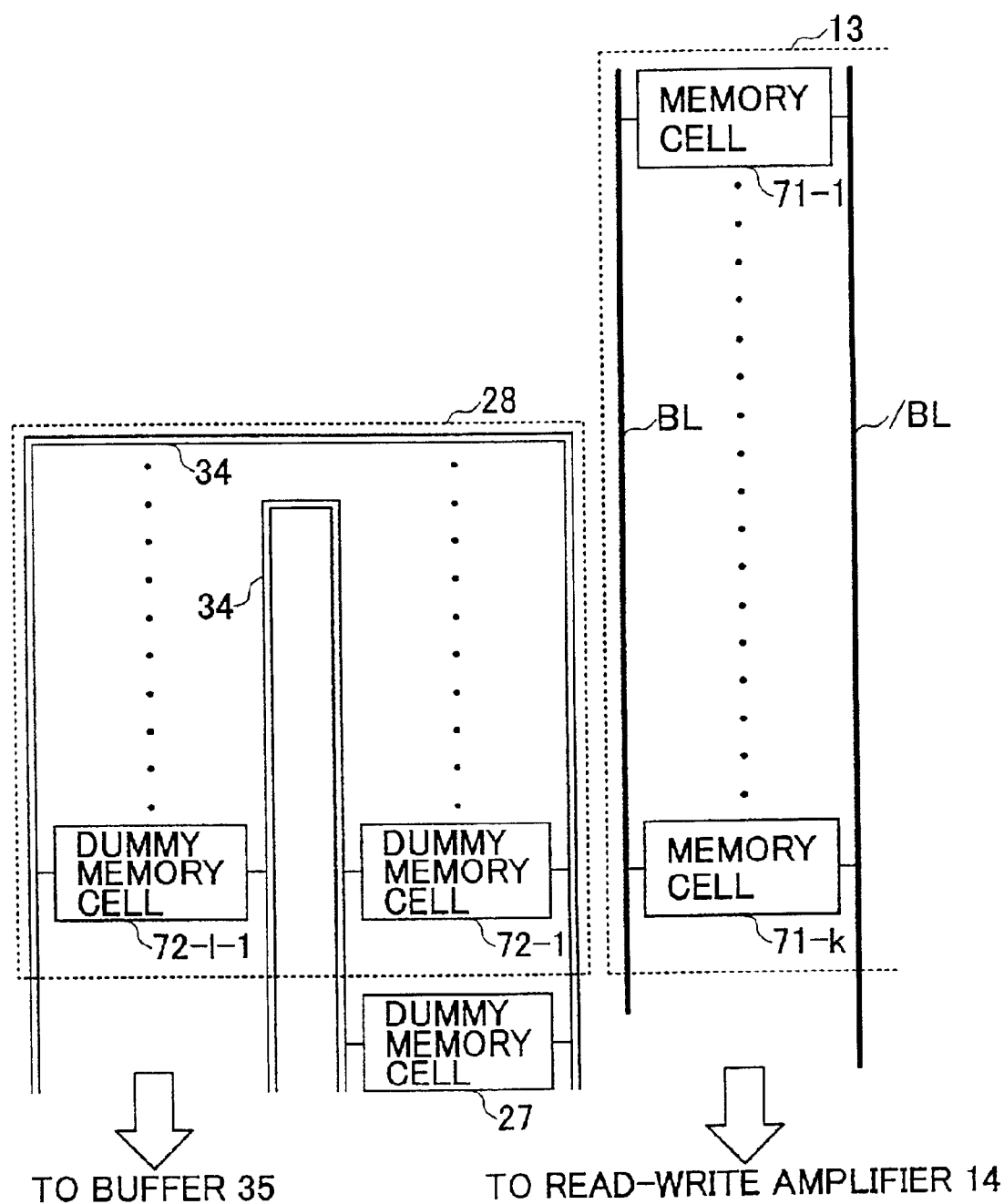
FIG. 6 is a circuit diagram for explaining the setting of a dummy load and a buffer drive capacity with respect to bit lines of the memory cell array and dummy bit lines of the dummy bit line circuit.

FIG. 6 is a circuit diagram for explaining the setting of a dummy load and a buffer drive capacity with respect to bit lines of the memory cell array 13 and the dummy bit line 34 of the dummy bit line circuit 28.

As shown in FIG. 6, the memory cell array 13 includes bit lines BL and /BL and a plurality of memory cells 71-1 through 71-k. The memory cell 71-1 is the same as the memory cell 61-n that belongs to the critical path among the memory cells selected by the word line WL1 in FIG. 5. The memory cells 71-1 through 71-k are connected to the bit lines BL and /BL, and data of the selected memory cell 71-1 is transferred to the read-write amplifier 14 through the bit lines BL and /BL. Here, the number k of the memory cells 71-1 through 71-k may be 256, for example.

The dummy bit line circuit 28 includes a pair of dummy bit lines 34 and a plurality of dummy memory cells 72-1 through 72-1-1. The dummy bit lines 34 is connected to the dummy memory cells 72-1 through 72-1-1, and is further connected to the dummy memory cell 27. Accordingly, the dummy bit lines 34 has the total number 1 of dummy memory cells connected thereto. The number 1 of the dummy memory cell is 16, for example. The dummy bit lines 34 carry the dummy data (dummy-memory-cell signals) of the dummy memory cell 27, and supplies it to the buffer 35 shown in FIG. 3. The buffer 35 may be an inverter, and serves as a dummy sense amplifier to amplify the received signal, followed by supplying the amplified signal to the control circuit 11.

The wire load of the dummy bit lines 34 is set to one sixteenth of the wire load of the bit lines BL and /BL. The dummy bit lines 34 has the 16 dummy memory cells connected thereto as loads, and the bit lines BL and /BL has the 256 dummy memory cells attached thereto. Assuming that the memory cell 71-1 and the dummy memory cell 27 have the same circuitry structure, the data read from the dummy memory cell 27 has an amplitude on the dummy bit lines 34 that is one sixteenth of the amplitude of the data read from the memory cell 71-1 appearing on the bit lines BL and /BL.

The signals on the dummy bit lines 34 are amplified by the buffer 35 serving as a dummy sense amplifier, and are supplied to the control circuit 11. In response, the control circuit 11 generates a sense amplifier activation signal to activate the sense amplifiers of the read-write amplifier 14. The sense amplifier activation signal serves as a timing control signal that defines timing by simulating actual memory access, thereby making it possible to cancel timing deviation caused by product variation in a reliable manner.

In the present invention as described above, the self-timing circuit is provided at the corner of the memory cell array that is closest to the word decoder and the read-write amplifier, and has a reduced size with decreased dummy loads. Further, the capacity of buffers that drive the dummy circuits is reduced in proportion to the reduction of the dummy loads. This makes it possible to achieve a circuit configuration that consumes a less electric power than the related-art self-timing circuit, yet achieves timing control that cancels timing deviations caused by the product variation.

It should be noted that the delays of buffers with no load thereon needs to be taken into consideration like the buffers 30 and 30A shown in FIG. 4, for example. Delays without loads typically depend on the gate length regardless of the gate width if transistors of the same technology are used. Use of transistors having the same gate length, therefore, insures that the delays of buffers with no load thereon are set identical to each other.

Further, wire resistance also needs to be taken into consideration in addition to wire capacitance. In the case of word lines, the basic unit of a capacitance load is the wire capacitance of one memory cell plus the gate capacitance, so that a ratio of the wire capacitance load to the entire capacitance load is constant regardless of the number of memory cells. In the same manner, the effect of wire resistance on the entire delay is constant irrespective of the number of memory cells. Because of this reason, it suffices to take into account only the capacitance load.

Further, the present invention is not limited to these embodiments, but various variations and modifications may be made without departing from the scope of the present invention.

The present application is based on Japanese priority application No. 2001-182067 filed on Jun. 15, 2001, with the Japanese Patent Office, the entire contents of which are hereby incorporated by reference.

What is claimed is:

1. A semiconductor memory device, comprising:

a data access path for accessing a memory cell;

a signal drive circuit which drives a signal on said data access path;

a dummy path that emulates said data access path; and a dummy drive circuit which emulates said signal drive circuit, wherein said dummy path has a smaller load than said data access path, and said dummy drive circuit has a smaller drive capacity than said signal drive circuit; and further comprising:

a control circuit which generates a timing control signal in response to a signal having propagated through said dummy path; and an input/output circuit which amplifies a signal at timing responsive to the timing control signal, wherein a point farthest away on said dummy path from said control circuit is closer to said control circuit than is a point farthest away on said data access path from said control circuit, wherein said data access path and said signal drive circuit include:

a decoder circuit which is driven by said control circuit; and a memory cell array which includes word lines, memory cells, and bit lines driven in response to said decoder circuit, and wherein said dummy path and said dummy drive circuit include:

a dummy word decoder which emulates said decoder circuit;

a dummy word line circuit which emulates at least one of said word lines;

a dummy memory cell which emulates at least one of said memory cells; and a dummy bit line circuit which emulates the bit lines, wherein said dummy word decoder, said dummy word line circuit, said dummy memory cell, and said dummy bit line circuit are situated at a corner of said memory cell array closest to said decoder circuit and said input/output circuit.

2. The semiconductor memory device as claimed in claim 1, wherein said dummy word decoder includes a dummy decode line having a predetermined fraction of a load of a decode line of said decoder circuit, and wherein said control circuit includes:

a first buffer which drives the decode line of said decoder circuit; and a second buffer which has said predetermined fraction of a drive capacity of said first buffer, and drives the dummy decode line.

3. The semiconductor memory device as claimed in claim 1, wherein said dummy word line circuit includes a dummy word line having a predetermined fraction of a load of a word line of said memory cell array, and said decoder circuit includes a first buffer for driving the word line of said memory cell array, and wherein said dummy word decoder includes a second buffer which has said predetermined fraction of a drive capacity of said first buffer, and drives said dummy word line.

4. The semiconductor memory device as claimed in claim 1, wherein said dummy bit line circuit includes dummy bit lines which have a smaller load than the bit lines of said memory cell array.

5. The semiconductor memory device as claimed in claim 1, wherein said dummy word line circuit include a dummy word line that extends in the same direction as the word lines, and is folded to make a U-turn, and wherein said dummy bit line circuit includes dummy bit lines that extend in the same direction as the bit lines of said memory cell array, and are folded to make a U-turn.

6. The semiconductor memory device as claimed in claim 1, wherein said dummy path has a predetermined fraction of a load of said data access path, and said dummy drive circuit has substantially said predetermined fraction of a drive capacity of said signal drive circuit.

7. The semiconductor memory device as claimed in claim 1, wherein a signal delay of said dummy path is substantially equal to a signal delay of said data access path.

8. A semiconductor memory device, comprising a self-timing circuit which emulates data access to a memory cell so as to generate a timing control signal, said self-timing circuit using a dummy path having a relatively small load compared with a circuit that is emulated, and driving the dummy path by a drive capacity that is relatively small compared with a drive capacity that drives the circuit that is emulated, wherein a point farthest away on said dummy path from said self-timing circuit is closer to said self-timing circuit than is a point farthest away on said data access from said self-timing circuit, and wherein said semiconductor memory device further includes:

a decoder circuit which is driven by a control circuit; and a memory cell array which includes word lines, memory cells, and bit lines driven in response to said decoder circuit, and wherein said dummy path and said self-timing circuit include:

a dummy word decoder which emulates said decoder circuit;

a dummy word line circuit which emulates at least one of said word lines;

a dummy memory cell which emulates at least one of said memory cells;

a dummy bit line circuit which emulates the bit lines, wherein said dummy word decoder, said dummy word line circuit, said dummy memory cell, and said dummy bit line circuit are situated at a corner of said memory cell array closest to said decoder circuit and said input/output circuit.

* * * * *